United States Patent [19]
Wang

[11] Patent Number: 5,733,609
[45] Date of Patent: Mar. 31, 1998

[54] CERAMIC COATINGS SYNTHESIZED BY CHEMICAL REACTIONS ENERGIZED BY LASER PLASMAS

[76] Inventor: Liang Wang, 5129 Maddox Rd., Tallahassee, Fla. 32303

[21] Appl. No.: 69,877

[22] Filed: Jun. 1, 1993

[51] Int. Cl.$^6$ .................. B05D 5/12; B05D 3/00; C23C 14/00
[52] U.S. Cl. .................. 427/561; 427/568; 427/596; 427/586
[58] Field of Search .................. 427/568, 586, 427/587, 596, 597, 561; 219/121.85, 121.64

[56] References Cited

U.S. PATENT DOCUMENTS

| | | | |
|---|---|---|---|
| 4,664,940 | 5/1987 | Bensoussan et al. | 427/596 |
| 4,816,243 | 3/1989 | Hiramoto et al. | 427/596 |
| 4,837,044 | 6/1989 | Murarka et al. | 427/568 |
| 4,892,751 | 1/1990 | Miyake et al. | 427/586 |
| 4,987,007 | 1/1991 | Wagal et al. | 427/596 |
| 5,015,492 | 5/1991 | Venkatesan et al. | 427/596 |
| 5,019,552 | 5/1991 | Balooch et al. | 427/596 |
| 5,032,571 | 7/1991 | Takemura | 427/586 |
| 5,096,739 | 3/1992 | Strutt et al. | 427/587 |
| 5,096,740 | 3/1992 | Nakagama et al. | 427/587 |
| 5,098,737 | 3/1992 | Collins et al. | 427/596 |
| 5,124,310 | 6/1992 | Ovshinsky et al. | 427/586 |
| 5,145,713 | 9/1992 | Venkatesan et al. | 427/596 |
| 5,158,931 | 10/1992 | Noda et al. | 427/596 |
| 5,168,097 | 12/1992 | Araya et al. | 427/596 |
| 5,187,147 | 2/1993 | Ng et al. | 427/596 |
| 5,227,204 | 7/1993 | Vittoria | 427/586 |
| 5,236,895 | 8/1993 | Nishiyama et al. | 427/596 |
| 5,242,706 | 9/1993 | Cotell et al. | 427/586 |
| 5,264,412 | 11/1993 | Ota et al. | 427/596 |
| 5,296,274 | 3/1994 | Movchan et al. | 427/586 |

*Primary Examiner*—Marianne Padgett

[57] ABSTRACT

The methods for ceramic coatings synthesized by chemical reactions energized by laser plasmas were invented. Laser plasmas were generated by pulsed laser beams focused by a reflector having a hole. The ions and electrons were formed by the laser plasmas from gaseous molecules or solid materials. The first method applied an electric or a magnetic field to separate ions from electrons and to promote ion-atom and ion-molecule reactions. The product molecular ions were focused and deflected to coat patterned coatings with extremely high precision. The second method allowed the electron-ion recombinations to form product molecules or radicals to form high uniform coatings. These two methods and their combinations provides consistent, or continuous modulations, or discrete layers in vast varieties of chemical compositions and crystal structures. Ceramic films were separated by dissolving the substrates.

28 Claims, 6 Drawing Sheets

CERAMIC COATINGS SYNTHESIZED BY CHEMICAL REACTIONS ENERGIZED BY LASER PLASMAS

BACKGROUND OF THE INVENTION

1. Background—Field of Invention

This invention relates to the methods for the ceramic films and coatings synthesized by the chemical reactions energized by laser plasmas, and specifically to ceramic coatings with high uniform, extremely high pattern precision, with consistent, or continuous modulations, or discrete layers in vast varieties of chemical compositions and crystal structures by a molecular spray and by molecular ion beams.

2. Background—Cross-Reference to Related Applications

Laser plasma is a state of matter formed by focused laser beams, in which ionized gases are produced by the matter with high energy density.

Spectroscopic studies of the chemical reactions of nitrogen molecules with carbon ions and atoms energized by laser plasmas were done by the author in 1987 [1]. A device for the chemical reactions energized by laser plasmas were developed in the thesis. However, there is no patent related to ceramic films or coatings synthesized by chemical reactions energized by laser plasmas.

Objects and Advantages

Accordingly, an object of the present invention is to provide the methods for synthesis of high quality, high precision, and uniform ceramic films and coatings by chemical reactions energized by laser plasmas.

The advantages of this invention are that (I) The ceramic films and coatings produced have specified patterns with extremely high precision.

(II) The ceramic films and coatings produced have precisely specified properties with either a consistent, or continuous modulations, or discrete multi-layers in compositions and structures.

(III) A vast chemical variety of ceramic films and coatings which are hard to be synthesized by an existing method can be synthesized with this method.

(IV) Uniform and smooth ceramic films and coatings grown epitaxially with molecular ions, radicals, molecules without the splash of liquid drops or solid particles can be produced.

(V) A simple and convenient coating device for coatings can be provided.

(VI) The ceramic films and coatings produced have high tensile strength, hardness, and adhesion. The surfaces of the invented films and coatings are exceptional durable against abrasion, friction, and scratching.

(VII) The ceramic films and coatings produced have high chemical stability. The surfaces of invented films and coatings have excellent anticorrosion properties in concentrated acids, alkalis, salts, organic solvents, sea water, and severe atmospheres, alone or in combination.

(VIII) The ceramic films and coatings produced have high thermal stability.

(IX) The ceramic films and coatings produced are excellent diffusion barrier for ions.

(X) The multi-layered and superlattice ceramic films and coatings produced have unique electro-optic, piezo-optical, ferroelectric, microwave resonance, photochemical, photoferroelectric, dielectric, electrodes for fuel cell, and semiconductive properties.

(XI) No sintering process is necessary.

SUMMARY OF THE INVENTION

These objects and others which will become apparent hereinafter in accordance with the present invented methods, which produce ceramic films and coatings having high uniform, extremely high pattern precision, consistent, or continuous modulations, or discrete multi-layers in vast varieties of chemical compositions and crystal structures.

According to this invention, there is provided a method for the synthesizing of ceramic coatings with vast varieties of chemical compositions and crystal structures.

According to this invention, there is provided a method for the formation of ceramic coatings, wherein at least one of the activated chemical species is supplied by laser plasmas by atomization and ionization of a gas, or a vapor evaporated from a moving solid target having the shape of a tape, or a wire, or a disc, or a cylindrical rod.

According to this invention, there is provided a method for ceramic coatings with extremely precise patterns by molecular ion beams, in which the method comprises of: (I) forming laser plasmas with focused laser beams by a reflector, (II) energizing at least one of the reactant species by ionizing gaseous molecules with the laser plasmas, (III) applying an electric field to separate ions from electrons, to focus ion beams, and to promote ion-atom and ion-molecule reactions, (IV) applying an electric field or a magnetic field to deflect molecular ion beams, (III) coating a substrate with precise patterns by the molecular ion beams.

According to this invention, there is provided a method for ceramic coatings with extremely precise patterns by molecular ion beams, in which the method comprises of: (I) forming laser plasmas by focusing laser beams with a reflector, (II) energizing at least one of the reactant species by evaporating, and ionizing a solid material with the laser plasmas, (III) applying an electric field to separate ions from electrons, to focusing/on beams, and to promote ion-atom and ion-molecule reactions, (IV) applying an electric field or a magnetic field to deflect molecular ion beams, (V) coating a substrate with precise patterns by the molecular ion beams.

According to this invention, there is provided a method for uniform ceramic coatings by a molecular spray, in which the method comprises of: (I) forming laser plasmas by focusing laser beams with a reflector, (II) energizing at least one of the reactant species by ionizing gaseous molecules with the laser plasmas, (III) coating a substrate with the reaction products formed by the chemical reactions between the energized reactant species and gas molecules.

According to this invention, there is provided a method for uniform ceramic coatings by a molecular spray; in which the method comprises of: (I) forming laser plasmas by focusing laser beams with a reflector, (II) energizing at least one of the reactant species by evaporating and ionizing a solid material with the laser plasmas, (III) coating a substrate with the reaction products formed by the chemical reactions between the energized reactant species and gas molecules.

According to this invention, there is provided a method for conducting chemical reactions energized by laser plasmas for the synthesis of ceramic coatings with extremely high precise patterns by molecular ion beams, which consists of a device to spray gas or vapor, or a device to move a solid target, a laser beam source with an optical system collimating the laser beams on the surface of a focusing reflector, the reflector having a hole and a paraboloidal or ellipsoidal surface focusing the laser beams to form laser plasmas in the front of a gas nozzle, or on the facing surface of a moving target to produce ionized gas, an electric field to separate ions from electrons and to promote ion-atom and ion-molecule reactions, an ion focusing system to focus molecular ions to form molecular ion beams, an ion deflection system to deflect the molecular ion beams, the substrate which is negatively charged to neutralize the charges of molecular ions for forming a patterned coating.

According to this invention, there is provided a method for conducting chemical reactions energized by laser plasmas for the synthesis of uniform ceramic coatings by a molecular spray, which consists of a device to spray gas or vapor, or a device to move a solid target, a laser beam source with an optical system to collimate the laser beams on a focusing reflector having a hole and a paraboloidal or ellipsoidal surface to focus the laser beams to form laser plasmas in the front of a gas nozzle, or on the facing surface of a moving target to produce ions and electrons to produce ionized gases, a space for forming atoms from the electron-ion recombinations and for producing molecules from atom-molecule and atom-atom reactions, the substrate for form an uniform coating.

According to this invention, there is provided a method for the formation of ceramic coatings with an abrupt change of compositions, to form a discrete multi-layered, including superlattice, ceramic coating, in which the method comprises of coating a substrate consequently using at least two coating devices.

According to this invention, there is provided a method for the formation of ceramic coatings with continuous modulations of compositions selected from the group consisting of borides, carbides, nitrides, oxides, oxynitrides, silicides, phosphides, sulfides, arsenides, selenides, tellurides, other ceramics, and a mixture thereof, in which the method comprises of coating a substrate simultaneously with continuous modulations of the compositions using at least two coating devices by the means of changing the ratios of the distributed laser energy to the coating devices.

According to this invention, there is provided a method for the formation of a patterned coating, in which the method comprises of coating a substrate with the products of the chemical reactions energized by laser plasmas, where at least one molecular ion beam coating device, or an splayed molecule coating device with at least one aperture mask is used.

According to this invention, there is provided a method for the formation of ceramic films selected from the group consisting of borides, carbides, nitrides, oxides, oxynitrides, silicides, phosphides, sulfides, arsenides, selenides, tellurides, other ceramics, and a mixture thereof, in which the method comprises of coating a substrate and subsequently dissolving the substrate.

BRIEF DESCRIPTION OF THE DRAWING

The accompanying drawings, which are incorporated in and form a part of the specification, illustrate six embodiments of the present invention and, together with the description, serve to explain the principles of the invention. In the drawings.

Figure 1:
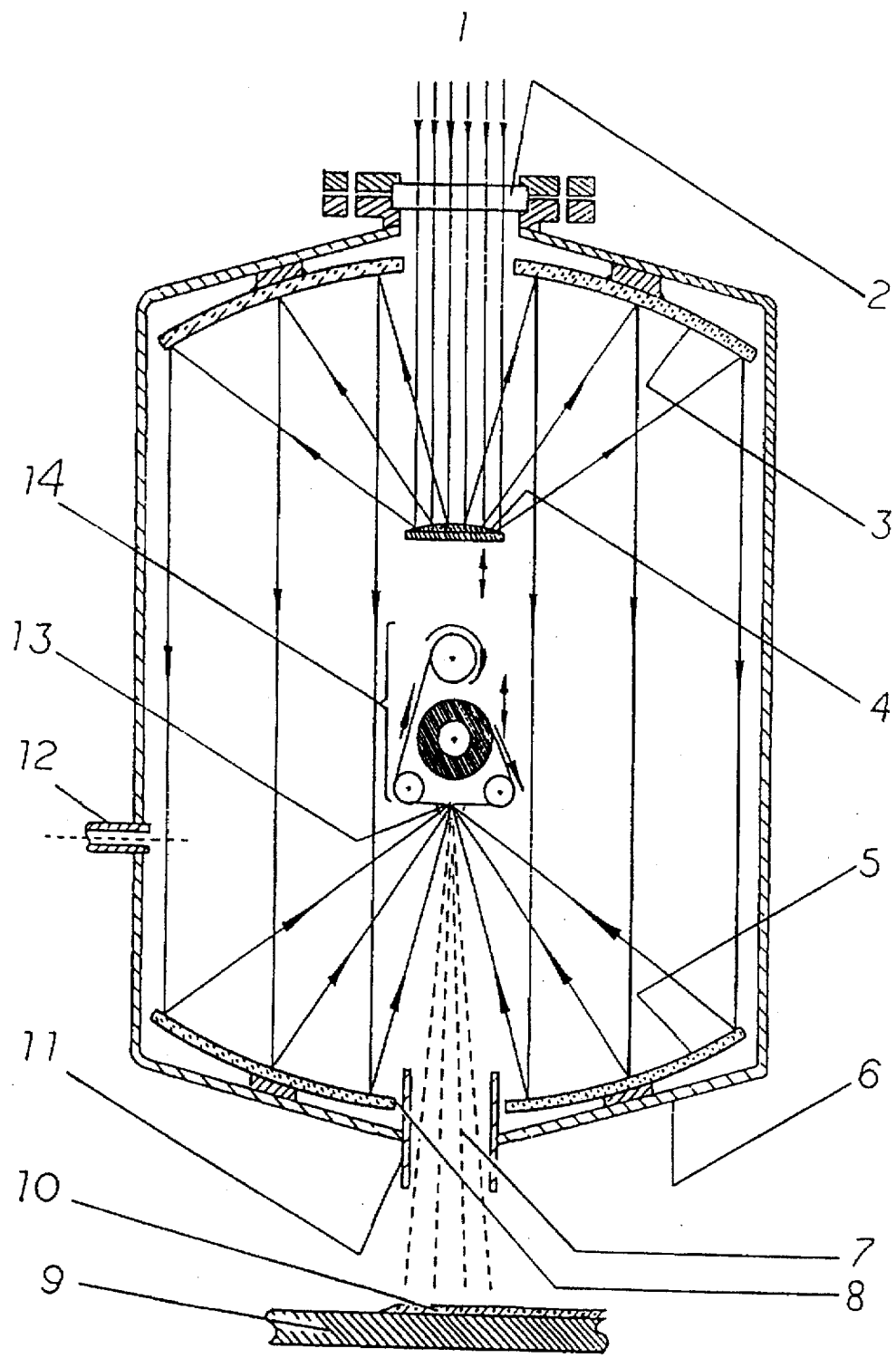
FIG. 1 is a schematic representation of a molecular spray coating device for chemical reactions energized by laser plasmas with a wire target driven by a wire feeder generating thereby synthetic ceramic coatings by this invention.

The above and other objects and features of the invention will become more apparent from the following detailed description with reference to the accompanying drawings

DETAILED DESCRIPTION OF THE PREFERRED EMBODIMENT

An object of the present invention is to provide the methods for conducting chemical reactions energized by laser plasmas for the synthesis of the ceramic coatings, and specifically to the ceramic films and coatings with high uniform, extremely high pattern precision, consistent, or continuous modulations, or discrete layers in vast varieties of chemical compositions and crystal structures by a molecular spray, by molecular ion beams, and by their combinations.

Laser plasma is the fourth state of matter formed by a focused laser beam with laser flux density exceeding an irradiance threshold in a tiny spatial region, in which high energy density converts matter to ionized gases.

According to this invention, there is provided a method for conducting chemical reactions energized by laser plasmas for the synthesis of coatings with extremely precise patterns by molecular ion beams. A method for the films and coatings by molecular ion beams is realized by chemical reactions energized by laser plasmas in a coating device. When the laser plasmas are formed in the tiny space in the front near a gas nozzle by a focusing reflector having a hole, the molecules from a gas or a vapor are ionized. When the laser plasmas are formed on or near a solid target, the material of the solid target is evaporated and ionized. The ions energized by the laser plasmas expand along the direction perpendicular to the gas nozzle or the surface of the solid target. An electric field is applied to separate ions from electrons. The positively charged electrodes to collect electrons. Electron-ion recombinations are suppressed due to the deficiency of the electrons. The reactions of ion-molecule and ion-atom are promoted to form molecular ions. The ion focusing electric field focuses and accelerates the positively charged molecular ions to form molecular ion beams. A deflection system with two pairs of electrode plates, one pair perpendicular to the other, or with a magnetic field deflection system, is applied to deflect molecular ion beams, the substrate is negatively charged to neutralize the charges of molecular ions to form a patterned coating with extremely high precision.

According to this invention, an ion focusing system with a high electric field of 1 to 10 KV is applied between the anodes where the laser plasmas are formed and the cathode where the molecular ion beams pass through. A deflection system is used to direct ion beams in space. A electrostatic deflection system can be mounted in the coating device, which consists of two pairs of deflection plates. One pair is for X-axis deflection, the other pair is for Y-axis deflection. A magnetic deflection system may be mounted outside of the coating device to save space. A negative electric field of −0.5 to −10 KV is applied between the substrate as cathode and the chamber wall as the electric ground.

Since the wavelength of a matter determines the ultimate precision of the coated patterns, it was given by the equation $$\Lambda = h/mv$$

where $\Lambda$ is the wavelength, h is Planck's constant, m is the mass of the particle, and v is its velocity. The wavelengths of molecular ions with high velocities are very short. For example, the wavelength of a boron nitride molecular ion with an average kinetic energy at room temperature is comparable with the dimension of the molecular ion.

According to this invention, there is provided a method for conducting chemical reactions energized by laser plasmas for the synthesis of uniform and smooth ceramic coatings by a molecular spray. A method for the films and coatings by a molecular spray is realized by chemical reactions energized by laser plasmas in a coating device. When the laser plasmas are formed in the tiny space in the front near a gas nozzle by a focusing reflector having a hole, the molecules from a gas or a vapor are ionized. When the laser plasmas are formed on or near a solid target, the material of the solid target is evaporated and ionized. Recombination of ions and electrons form atoms. The atoms energized by laser plasmas expand along the direction perpendicular to the gas nozzle or surface of the solid target. The atoms and surrounding molecules react with each other by the atom-molecule and atom-atom reactions to form product radicals and molecules. The product radicals and molecular pass though the hole in the reflector and spray onto the substrate to form a uniform and smooth ceramic coating.

According to the first aspect of the present invention, there is provided a method for conducting chemical reactions energized by laser plasmas for the synthesis of the ceramic coatings with extremely precise patterns, in which the method comprises of: (I) forming laser plasmas by focusing laser beams with a reflector, (II) energizing at least one of the reactant species by ionizing gaseous molecules from a spraying gas or vapor with the laser plasmas, (III) applying an electric field to separate ions from electrons and focusing ion beams, therefore to promote ion-atom and ion-molecule reactions, (IV) applying an electric field or a magnetic field to deflect molecular ion beams, (III) coating a ceramic coating on a substrate with precise patterns by the molecular ion beams.

According to the second aspect of the present invention, there is provided a method for conducting chemical reactions energized by laser plasmas for the synthesis of the ceramic coatings with extremely precise patterns, in which the method comprises of: (I) forming laser plasmas by focusing laser beams with a focusing reflector, (II) energizing at least one of the reactant species by evaporating and ionizing a moving solid target with the laser plasmas, (III) applying an electric field to separate ions from electrons and focusing ion beams, therefore to promote ion-atom and ion-molecule reactions, (IV) applying an electric field or a magnetic field to deflect molecular ion beams, (V) coating a ceramic coating on a substrate with extremely precise patterns by molecular ion beams.

According to the third aspect of the present invention, there is provided a method for conducting chemical reactions energized by laser plasmas for the synthesis of uniform ceramic coatings, in which the method comprises of: (I) forming laser plasmas by focusing laser beams with a focusing reflector, (II) energizing at least one of the reactant species by atomizing gaseous molecules from a spraying gas or vapor with the laser plasmas, (III) coating a substrate with the reaction products by a molecular spray.

According to the forth aspect of the present invention, there is provided a method for conducting chemical reactions energized by laser plasmas for the synthesis of uniform ceramic coatings, in which the method comprises of: (I) forming laser plasmas by focusing laser beams with a focusing reflector, (II) energizing at least one of the reactant species by evaporating and atomizing a moving solid target with the laser plasmas, (III) coating a substrate with the reaction products by a molecular spray.

According to the fifth aspect of the present invention, there is provided a method for the formation of ceramic coatings with an abrupt change of compositions, to form a discrete multi-layered, including superlattice, synthetic ceramic coating with the compositions selected from the group consisting of borides, carbides, nitrides, oxides, oxynitrides, silicides, phosphides, sulfides, arsenides, selenides, tellurides, other ceramics, and a mixture thereof, in which the method comprises of coating a substrate consequently using at least two coating devices.

According to the sixth aspect of the present invention, there is provided a method for the formation of ceramic coatings with continuous modulations of chemical compositions and crystal structures to form modulated ceramic coatings with compositions selected from the group consisting of borides, carbides, nitrides, oxides, oxynitrides, silicides, phosphides, sulfides, arsenides, selenides, tellurides, other ceramics, and a mixture thereof, in which the method comprises of coating a substrate simultaneously with continuous modulations of the compositions using at least two coating devices by the means of changing the ratios of the distributed laser energy to the coating devices.

According to the seventh aspect of the present invention, there is provided a method for the formation of a patterned coating, in which the method comprises of coating a substrate with the products of the chemical reactions energized by laser plasmas, where at least one molecular ion beam coating device with an electric or a magnetic deflection device is used, or at least one splayed molecule coating device with at least one aperture mask is used.

According to the eighth aspect of the present invention, there is provided a method for the formation of ceramic films selected from the group consisting of borides, carbides, nitrides, oxides, oxynitrides, silicides, phosphides, sulfides, arsenides, selenides, tellurides, other ceramics, and a mixture thereof, in which the method comprises of coating a substrate and subsequently dissolving the substrate. Acids or alkali solutions can be used for dissolving substrates made of metals or alloys, organic solvents can be used to dissolving substrates made of polymers.

According to this invention, there is provided a method for the formation of ceramic coatings with vast varieties of chemical reactions energized by laser plasmas which atomize and ionize materials to atoms and ions. The electron-ion recombinations form atoms. The reactants energized by laser plasmas produce activated atoms with high reactivity, which react with reactant atoms or molecules to produce product molecules. When a high electric field is applied to positively charged electrodes to collect electrons. Electron-ion recombinations are suppressed due to the deficiency of the electrons. The reactions of ion-molecule and ion-atom are promoted to produce product molecular ions. The following examples provide a general aspect:

Laser plasmas atomize and ionize a boron-containing compound to produce boron atoms and ions, which react with tungsten carbonyl molecules to form tungsten boride molecules and molecular ions, for example $$B+W(CO)_6=WB+6\ CO$$

$$B^++W(CO)_6=WB^++6\ CO.$$

Laser plasmas atomize, dissociate, and ionize a solid target containing graphite and titania to produce carbon atoms and ions, titanium atoms and ions, which combine to produce molecules and molecular ions of titanium carbide, for example $$Ti+C=TiC$$

$$Ti^++C=TiC^+.$$

Laser plasmas atomize and ionize a solid target containing aluminum to produce aluminum atoms and ions, which react with nitrogen to produce molecules or molecular ions of aluminum nitride, for example $$Al+N_2=AlN+N$$

$$Al^++N_2=AlN^++N.$$

Laser plasmas atomize and ionize a solid target containing lithium bromide and niobium bromide to produce atoms and ions of lithium and niobium, which react with oxygen to produce molecules or molecular ions of lithium niobate, for example $$Li+Nb+2\ O_2=LiNbO_3+O$$

$$Li^++Nb+2O_2=LiNbO_3^++O$$

$$Li+Nb^++2\ O_2=LiNbO_3^++O.$$

Laser plasmas atomize and ionize a platinum target to produce platinum atoms and ions, which react with silicon chloride to produce molecules or molecular ions of platinum silicide, for example $$Pt+SiCl_4=PtSi+2\ Cl_2$$

$$Pt^++SiCl_4=PtSi^++2\ Cl_2.$$

Laser plasmas atomize, dissociate, and ionize a gas mixture of gallium hydride, trimethyl indium, arsine, and phosphine to produce atoms and ions of gallium, indium, arsenic and phosphorus, which combine to produce molecules and molecular ions of gallium indium arsenic phosphide, for example $$Ga+In+As+P=GaInAsP$$

$$Ga+In^++As+P=GaInAsP^+$$

$$Ga^++In+As+P=GaInAsP^+.$$

Laser plasmas atomize, dissociate, and ionize a solid target made of a mixture of indium chloride, and selenium chloride to produce atoms and ions of indium, and selenium, which combine to produce molecules and molecular ions of indium selenide, for example $$In+Se=InSe$$

$$In^++Se=InSe^+.$$

Laser plasmas atomize and ionize a solid target containing lead to produce lead atoms and ions, which react with sulfur hexafluoride to produce molecules and molecular ions of lead sulfide, for example $$Pb+SF_6=PbS+3\ F_2$$

$$Pb^++SF_6=PbS^++3\ F_2.$$

Laser plasmas atomize and ionize a solid target made of mercury telluride and cadmium chloride to produce atoms and ions of mercury, tellurium and cadmium, which react to produce molecules or molecular ions of mercury cadmium telluride, for example $$Hg+Cd+Te=HgCdTe$$

$$Hg^++Cd+Te=HgCdTe^+$$

$$Hg+Cd^++Te=HgCdTe^+.$$

According to this invention, there is provided a method for the formation of ceramic coatings with vast varieties of chemical compositions and crystal structures, wherein at least one of the activated chemical species is supplied by laser plasma atomization and ionization of the gaseous reactants. The molecules of the gaseous reactants are selected from the group consisting of metal-containing compounds, nonmetal containing compounds, boron-containing compounds, carbon-containing compounds, nitrogen-containing compounds, silicon-containing compounds, phosphorus-containing compounds, sulfur-containing compounds, arsenic-containing compounds, selenium-containing compounds, tellurium-containing compounds, metal-containing organic compounds, metal-containing halides, metal-containing carbonyls, and metal-containing hyrides; said nonmetals are selected from the group consisting of B, C, Si, N, P, As, O, S, Se, Te, F, Cl, Br, I, and a mixture thereof; said metals are selected from the group consisting of alkalis, alkaline earth metals, lanthanides, transition metals, representative metals, and a mixture thereof, said alkalis are selected from the group consisting of Li, Na, K, Rb, and a mixture thereof; said alkaline earth metals are selected from the group consisting of Be, Mg, Ca, Sr, Ba, and a mixture thereof; said lanthanides are Y, La, Ce, Pr, Nd, Sm, Eu, Gd, Tb, Dy, Ho, Er, Tm, Yb, Lu, and a mixture thereof; said transition metals are selected from the group consisting of Sc, Ti, Zr, Hf, V, Nb, Ta, Cr, Mo, W, Mn, Fe, Co, Ni, Rh, Pd, Os, Pr, Cu, Ag, Au, Zn, Cd, Hg, and a mixture thereof; said representative metals are selected from the group consisting of Al, Ga, In, Tl, Ge, Sn, Pb, Sb, Bi, and a mixture thereof.

According to this invention, there is provided a method for the formation of ceramic coatings with vast varieties of chemical compositions and crystal structures, wherein at least one of the chemical species is supplied by laser plasma evaporation, atomization, and ionization of a moving solid target having the shape of a tape, or a wire, or a disc, or a cylindrical rod. The solid targets contain the materials selected from the group consisting of nonmetals, metals, alloys of metals, metals doped with nonmetals, alloys of metals doped with nonmetals, metal-containing compounds, inorganic nonmetal-containing compounds, and a mixture thereof; the nonmetals are selected from the group consisting of B, C, Si, N, P, As, O, S, Se, Te, F, Cl, Br, I, and a mixture thereof; the metals are selected from the group consisting of alkalis, alkaline earth metals, lanthanides, transition metals, representative metals, and a mixture thereof; the alkalis are selected from the group consisting of Li, Na, K, Rb, and a mixture thereof; the alkaline earth metals are selected from the group consisting of Be, Mg, Ca, Sr, Ba, and a mixture thereof; the lanthanides are Y, La, Ce, Pr, Nd, Sm, Eu, Gd, Tb, Dy, Ho, Er, Tm, Yb, Lu, and a mixture thereof; the transition metals are selected from the group consisting of Sc, Ti, Zr, Hf, V, Nb, Ta, Cr, Mo., W, Mn, Fe, Co, Ni, Rh, Pd, Os, Pr, Cu, Ag, Au, Zn, Cd, Hg, and a mixture thereof; the representative metals are selected from the group consisting of Al, Ga, In, Tl, Ge, Sn, Pb, Sb, Bi, and a mixture thereof.

An intensive pulsed laser source is needed for producing laser plasmas. The excimer lasers, $CO_2$ lasers, He-Cd lasers, diode lasers, Alexandrite lasers, solid state lasers, including Nd:YAG lasers, Nd:YLF lasers, Tm:YAG lasers, Ho:YAG lasers, Er:YAG lasers, Ruby lasers, Ti:sapphire lasers, Er:Glass lasers, diode pumped solid state lasers are the suitable pulsed laser sources. However, shorter wavelengths have a higher efficiency for generating laser plasmas. The excimer lasers are the most powerful of all UV laser sources and has extremely high efficiencies. The wavelengths from commercially available excimer lasers range from 350 nm to 150 nm (XeF 351 nm, XeCl 308 nm, KrF 248 nm, and ArF 193 nm). A laser with unstable resonator optics provides a low divergent beam propagation and high focusability.

According to this invention, the incident laser beams need to be coaxial to a main optical axis, which is the optical axis of a focusing reflector. The incident laser beams which are perpendicular to or with an angle to the main optical axis are reflected and directed coaxial to the main optical axis by either reflective or refractive optical elements. The laser beams are focused in the front space or on or near the target surface to form laser plasmas where chemical species are energized for chemical reactions.

According to this invention, the coating device is applied for providing sprayed molecules from the product of the chemical reactions energized by laser plasmas for the purpose of coating, which consists of a laser beam source, an optical system to collimate the laser beams parallel to the optical axis of a focusing reflector, the focusing reflector having a hole and a surface, focusing the laser beams to form laser plasmas in the tiny space in the front of a gas nozzle, or on the facing surface of a moving target, a mechanical device to move the target, or a gas nozzle or valve, gas inlet to provide reaction gas, a chamber to provide space for confining said chemical reaction in a gas medium or in reduced pressure, and a device to support said substrate to he coated. Wherein the reflector is a solid mirror to reflect laser beams for energy concentration having a hole at the center for passing reaction products and having reflecting geometrical surfaces selected from the group consisting of concave spheres, concave parabolas, and concave ellipses.

According to this invention, the mechanical devices for moving the flexible solid targets are tape-feeders, or tape-drivers, or wire-feeders, or wire-drivers. The other choices of the shape for the solid material are discs and cylindric rods. The disc and cylindric shapes are for brittle, or non-flexible materials, or for the condition that a small operating space is critical. A mechanical device for the disc target must provide movement consisting to a rotation about an axis and a travel perpendicular to the axis. A mechanical device for a cylindric target must provide movement consisting of a rotation about and a translation along the longitudinal axis of the cylindric target which is perpendicular to the optical axis of the focusing reflector. In order to provide a fresh solid surface, the mechanical devices must move the solid target with the speed that a new surface is reached and an etched surface is moved after each pulse of the laser plasmas.

According to this invention, the coating device is applied for providing collimated molecular ion beams from the reaction products of the chemical reactions energized by laser plasmas for the purpose of coating, which consists of a laser beam source with an optical system to collimate the laser beams parallel to the optical axis of a focusing reflector, the focusing reflector having a reflecting geometrical surface selected from the group consisting of concave spheres, concave parabolas, and concave ellipses for focusing the laser beams to form laser plasmas in the tiny space in the front of a gas nozzle or a valve and having a hole on the reflector for passing reaction products, a gas nozzle or a solenoid valve providing reaction materials sprayed to the laser plasmas, and a gas inlet to provide reaction gas diffused to the laser plasmas. Since the laser plasmas expand perpendicular to the target surface and along the reflector's axis, the hole on the reflector provides a passage. An ion focusing electric field is applied to positively charged electrodes to collect electrons. The electric field focuses and accelerates the positively charged ions. Electron-ion recombinations are suppressed due to the deficiency of the electrons. The reactions of ion-molecule and ion-atom are promoted to form molecular ions. A deflection system with two pairs of electrode plates, one pair perpendicular to the other, or with a magnetic field deflection system is applied to collimate molecular ion beams. The substrate in negatively charged to neutralize the charges of molecular ions to form a patterned coating with extremely high precision. The solidifiable product molecular ions pass through the hole of the reflector and coat the substrate which is negatively charged to neutralize the positively charged molecular ions to form a patterned coating with extremely high precision. The solidifiable species are chemical species which form solid compounds having chemical compositions selected from the group consisting of borides, carbides, nitrides, oxides, silicides, phosphide, sulfide, arsenide, selenide, telluride, other ceramics, and a mixture thereof.

According to this invention, the coating device is applied for providing collimated molecular ion beams from the reaction products of the chemical reactions energized by laser plasmas for the purpose of coating, which consists of a laser beam source with an optical system to collimate the laser beams parallel to the optical axis of a focusing reflector, the focusing reflector having a reflecting geometrical surface selected from the group consisting of concave spheres, concave parabolas, and concave ellipses for focusing the laser beams on the facing surface of a moving target to form laser plasmas, where chemical reactions take place, and having a hole on the reflector for passing reaction products, a target providing reaction materials evaporated to the laser plasmas, a mechanical device to move the target, and a gas inlet to provide reaction gas diffused to the laser plasmas. Since the laser plasmas expand perpendicular to the target surface and along the reflector's axis, the hole on the reflector provides a passage. An ion focusing electric field is applied to positively charged electrodes to collect electrons. The electric field focuses and accelerates the positively charged ions. Electron-ion recombinations are suppressed due to the deficiency of the electrons. The reactions of ion-molecule and ion-atom are promoted to form molecular ions. A deflection system with two pairs of electrode plates, one pair perpendicular to the other, or with a magnetic field deflection system is applied to collimate molecular ion beams, to form a patterned coating with extremely high precision. The solidifiable product molecular ions pass through the hole of the reflector and coat the substrate which is negatively charged to neutralize the positively charged molecular ions to form a patterned coating with extremely high precision. The solidifiable species are chemical species which form solid compounds having chemical compositions selected from the group consisting of borides, carbides, nitrides, oxides, silicides, phosphide, sulfide, arsenide, selenide, telluride, other ceramics, and a mixture thereof.

According to this invention, an ion focusing system with a high electric field of 1 to 10 KV is applied between the anodes in the space where the laser plasmas are formed and the cathode in the space of the passage of the molecular ion beams which is connected to the electric ground. A deflection system is used to move around the ion beams. A electrostatic deflection system can be mounted in the coating device, which consists of two pairs of deflection plates. One pair is for X-axis deflection, the other pair is for Y-axis deflection. A magnetic deflection system may be mounted outside of the coating device to save space. A negative electric field of −0.5 to −10 KV is applied between the substrate as the cathode and the chamber wall as the electric ground.

According to this invention, the coating device is applied for providing spraying molecules from the products of the chemical reactions energized by laser plasmas for the purpose of coating, which consists of a laser beam source with an optical system to collimate the laser beams parallel to the optical axis of a focusing reflector, the focusing reflector having a reflecting geometrical surface selected from the group consisting of concave spheres, concave parabolas, and concave ellipses for focusing the laser beams to form laser plasmas in the tiny space in the front of a gas nozzle or a valve, where chemical reactions take place, and having a hole on the reflector for passing reaction products, a gas nozzle or a solenoid valve providing reaction materials sprayed to the laser plasmas, and a gas inlet to provide reaction gas diffused to the laser plasmas. Since the laser plasmas expand perpendicular to the target surface and along the reflector's axis, the hole on the reflector performs the function of a coating nozzle for the reaction products formed in the laser plasmas. The solidifiable in the reaction products pass through the hole of the reflector and coat the substrate. The solidifiable species are chemical species which form solid compounds having chemical compositions selected from the group consisting of borides, carbides, nitrides, oxides, silicides, phosphide, sulfide, arsenide, selenide, telluride, other ceramics, and a mixture thereof.

According to this invention, the coating device is applied for providing spraying molecules from the products of the chemical reactions energized by laser plasmas for the purpose of coating, which consists of a laser beam source with an optical system to collimate the laser beams parallel to the optical axis of a focusing reflector, the focusing reflector having a reflecting geometrical surface selected from the group consisting of concave spheres, concave parabolas, and concave ellipses for focusing the laser beams on the facing surface of a moving target to form laser plasmas, where chemical reactions take place, and having a hole on the reflector for passing reaction products, a target providing reaction materials evaporated to the laser plasmas, a mechanical device to move the target, and a gas inlet to provide reaction gas diffused to the laser plasmas. Since the laser plasmas expand perpendicular to the target surface and along the reflector's axis, the hole on the reflector performs the function of a coating nozzle for the reaction products formed in the laser plasmas. The solidifiable in the reaction products pass through the hole of the reflector and coat the substrate. The solidifiable species are chemical species which form solid compounds having chemical compositions selected from the group consisting of borides, carbides, nitrides, oxides, silicides, phosphide, sulfide, arsenide, selenide, telluride, other ceramics, and a mixture thereof.

According to this invention, when high purity or an optical quality coating is needed, the pressure in the coating device is maintained at a vacuum condition. The cleaning and preheating of the substrate is also necessary to obtain a high quality coating. When atmospheric pressure is the only practical condition, the coating device can be kept at atmospheric pressure.

According to this invention, an optional device applies a high positive electric field of 1 to 10 KV between the space where the laser plasmas are formed and the chamber wall which is connected to the electric ground. An negative electric field of −0.5 to −10 KV may be applied between the substrate as the cathode and the chamber wall as the electric ground. This electric field accelerates cations during the fight path and propels product molecules and radicals by collisions by the accelerated cations. The accelerated product molecules and radicals collide onto the substrate with high kinetic energy and result in a high adhesion strength of coatings.

According to this invention, wherein at least two coating devices are used sequentially, and each said device has a reflector and an unique reactant species, in which the method comprises of: (I) coating on a substrate with the first solidifiable species having the thickness of N micrometers by using the first coating device, where N is a positive real number, (II) coating on substrate with second solidifiable species having the thickness of M micrometers by using the second coating device, where M is a real number, (III) repeat N times of the procedures from I to II, until a N-layered ceramic coating, including superlattice is obtained.

According to this invention, wherein at least two coating devices are used simultaneously, and each said device has a reflector and an unique reactant species, in which the method comprises of: coating on a substrate with the solidifiable species from both coating devices, while changing the ratios of the laser powers incident to the two coating devices, resulting in continuous modulations of the chemical compositions and crystal structures in the ceramic coating depth.

According to this invention, wherein at least two coating devices are used, and each device has a reflector and an unique reactant species, wherein one aperture mask is placed between the reflector and the substrate, which the method comprises of: (I) coating on a substrate with the first solidifiable species having the thickness of N micrometers by using the first coating device with the first aperture mask, where N is a positive real number, (II) coating on the substrate with the second solidifiable species having the thickness of M micrometers by using the second coating device and with the second aperture mask which is different from said first aperture mask, where M is a real number.

The above and other objects and features of the invention will become more apparent from the following detailed description with reference to the accompanying drawings FIG. 1 shows a coating method with a molecular spray for carrying out the invention. The coating method is the first type with chamber 6, for providing chemical reactions energized by laser plasmas for the purpose of coating. A laser beam source (not shown) with an optical system (not shown) provides low divergent laser beams 1, which are parallel to the coating device's chamber axis. The main optical axes of curvatures of all the paraboloidal reflectors 3 and 5 coincide. The low divergent laser beams pass through the optical window 2 and enter the coating device chamber 6. The hyperboloidal reflector 4 reflects and disperses the input laser beams. The reflected laser beams incident on the surface of the paraboloidal reflector 3. The paraboloidal reflector 3 reflects and shapes the dispersed laser beams to laser beams parallel to the main optical axis. The parallel laser beams incident on the surface of the paraboloidal reflector 5, having a hole 8. The paraboloidal reflector 5 reflects and focuses the parallel laser beams on the facing surface of the moving solid target to form laser plasmas 13. The laser plasmas evaporate, dissociate, and ionize the solid target material to ions, electrons, atoms, and the recombinations of ions and electrons produce atoms. An inlet tube 12 provides an entrance for the reaction gas which reacts with ions, atoms, and radicals resulting from the evaporation, atomization, and ionization of target material in the laser plasmas. Chemical reactions energized by laser plasmas 13 produce reaction products: molecular ions, radicals, molecules. The reaction products 7 pass through the hole 8 on the reflector 5, the coating nozzle 11, and deposits on the substrate surface 9. A coating 10 is formed on the surface of the substrate. The assemble 14 is a wire or tape feeder moving the solid target which supplies reactants by laser plasma evaporation. The feeder moves the flexible target with the speed that a new area is reached and an etched area is moved after each pulse of the laser plasmas. The substrate 9 is heated by converted kinetic energy of the bombardment of the reaction products, or by a heater, or preheated by heating means (not shown).

Figure 2:
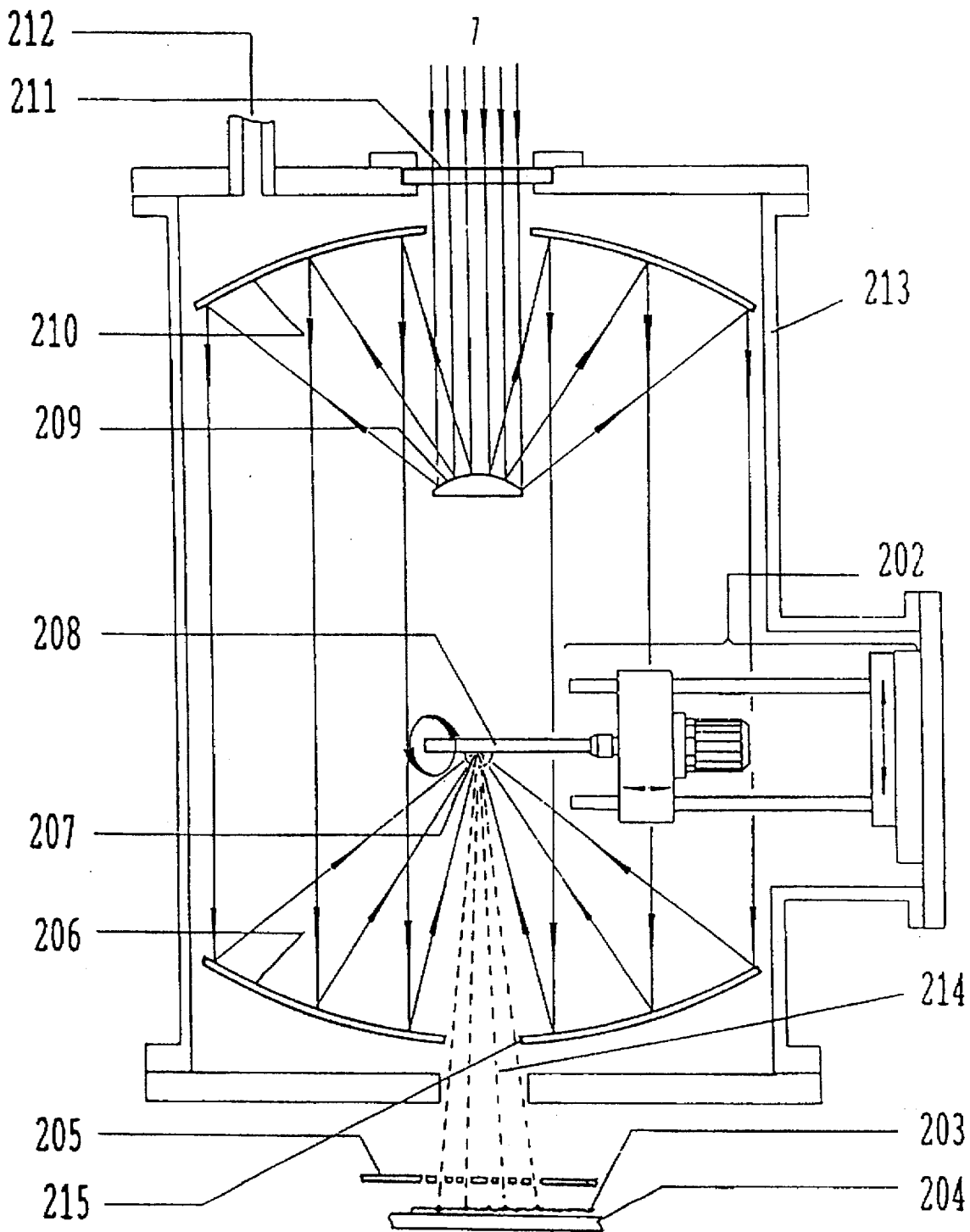
FIG. 2 is a schematic representation of a molecular spray coating device for chemical reactions energized by laser plasmas with a cylindric target driven by a rod feeder generating thereby synthetic ceramic coatings by this invention.

FIG. 2 shows a coating device With a molecular spray for carrying out the invention. The coating device is the second type with chamber 213 for providing chemical reactions energized by laser plasmas for the purpose of coating. A laser beam source (not shown) with an optical system (not shown) provides low divergent laser beams 1 which are parallel to the coating device's chamber axis. The low divergent laser beams pass through the optical window 211 and enter the coating device chamber 213. The hyperboloidal reflector 209 reflects and disperses the input laser beams. The reflected laser beams incident on the surface of the paraboloidal reflector 210. The paraboloidal reflector 210 reflects and shapes the dispersed laser beams parallel to the optical axis of reflectors 210 and 206. The parallel laser beams incident on the surface of the paraboloidal reflector 206 having a hole 215. The paraboloidal reflector 206 reflects and focuses the parallel laser beams on the facing surface of the moving target 208 to form laser plasmas 207. The laser plasmas evaporate, dissociate and ionize the solid target material to ions, electrons, atoms, and the recombinations of ions and electrons produce atoms. An inlet tube 212 provides an entrance for the reaction gas which reacts with ions, atoms, and radicals resulting from the evaporation, atomization, and ionization of target material in the laser plasmas. Chemical reactions energized by laser plasmas 207 produce reaction products: molecular ions, radicals, molecules. The reaction products 214 pass through the hole 215 on the chamber, mask 205, and deposits on the substrate surface 204. A patterned coating 203 is formed on the surface of the substrate 204. The assemble 202 is a mechanical device for the cylindric target which provides movement consisting of a rotational about and a translation along the longitudinal axis of the cylindric target which is perpendicular to the optical axis of the focusing reflector 206. This device has a X-Y-Z stage to adjust the cylindric target into a proper relative position respecting to the reflector 206. The mechanical device moves the cylindric target with the speed that a new area is reached and an etched area is moved after each pulse of the laser plasmas, The substrate is heated by converted kinetic energy of the bombardment of the reaction products, or by a heater, or preheated by heating means (not shown).

Figure 3:
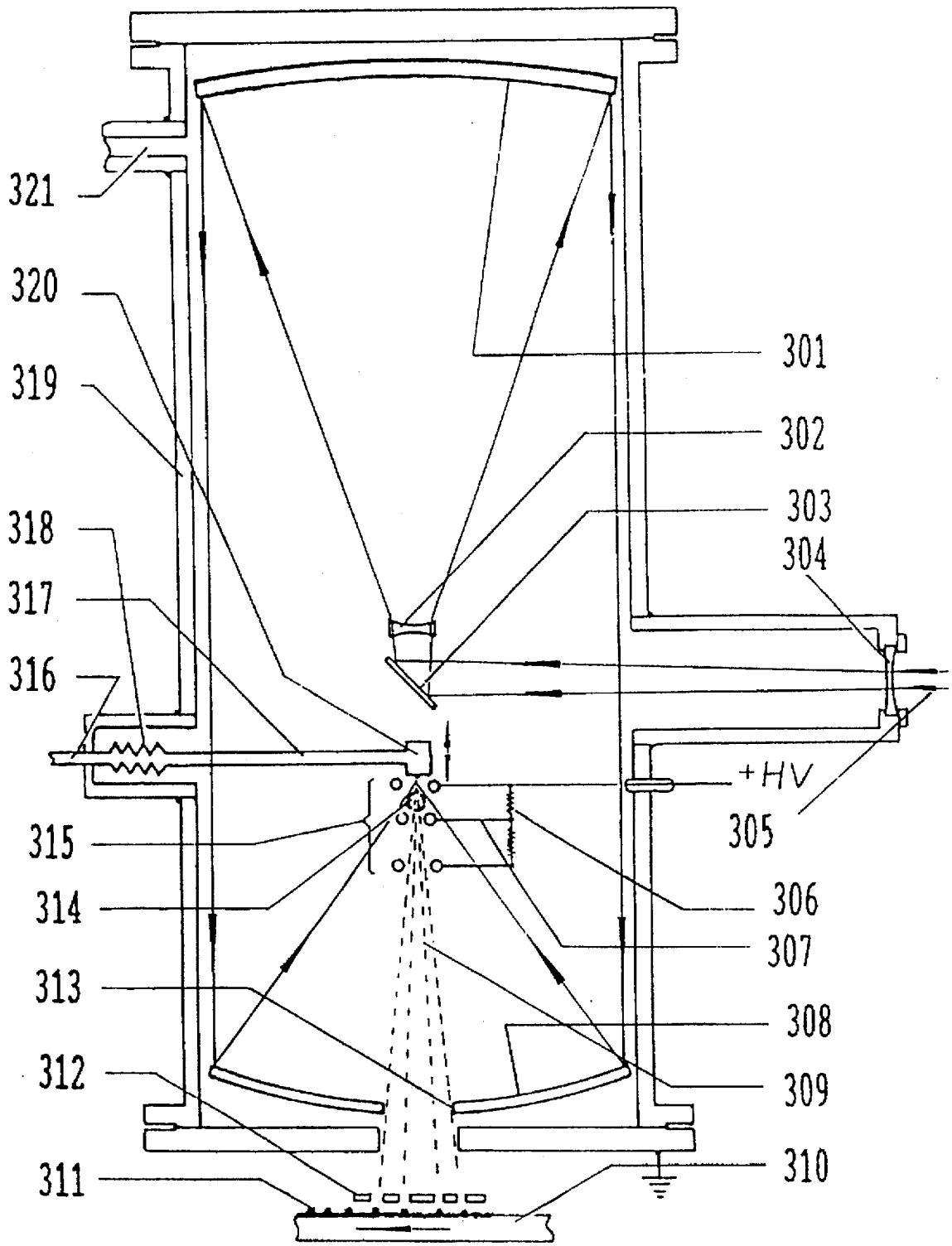
FIG. 3 is a schematic representation of a molecular spray coating device for chemical reactions energized by laser plasmas with a gas sprayed by gas nozzle generating thereby synthetic ceramic coatings by this invention.

FIG. 3 shows a coating method with a molecular spray for carrying out the invention. The coating device is the third type with a vacuum chamber 319 for providing chemical reactions energized by laser plasmas for the purpose of coating. A laser beam source (not shown) with an optical system (not shown) provides low divergent laser beams 305 which are perpendicular to the main optical axis of reflectors 301 and 308. The low divergent laser beams pass through the concave lens 304. The collimated incident laser beams are diverged and enter the coating device chamber 319. The diverged laser beams are reflected by mirror 303 and further diverged by the concave lens 302. The dispersed laser beams are incident on the surface of the paraboloidal reflector 301. The paraboloidal rejector 301 reflects and shapes the dispersed laser beams so they are parallel to the main optical axis. The parallel laser beams incident on the surface of the paraboloidal rejector 308, having a hole 313. The paraboloidal rejector 308 reflects and focuses the parallel laser beams on the front space neighboring the solenoidal gas nozzle 320 to form laser plasmas 314. The laser plasmas dissociate and ionize the gas molecules to atoms, ions, and electrons. The recombinations of ions and electrons produce atoms. Chemical reactions energized by laser plasmas 314 produce reaction products: molecular ions, radicals, and molecules, which pass through the accelerate electric field between parallel rings 315 and the chamber wall which is grounded electrically. The accelerated reaction products 309, molecular ions, molecules, and radicals pass through the hole 313, mask 312, and deposits on the substrate surface 310. A patterned coating 311 is formed on the surface of the substrate. The electrodes 315 are connected to high positive voltage with conducive wires 307 and resistors 306. The nozzle 320 is fitted with a X-Y-Z stage (not shown) to put it into a proper relative position respecting to the laser plasmas, and is connected to the inlet tubing 316 providing the first reaction species of gases and vapors. The bellows 318 which is connected between the nozzle tubing 317 and inlet tubing 316 provides flexibility for the movement of nozzle 320. The inlet gas tubing 321 provides the second species of reaction gases. The substrate is heated by converted kinetic energy of the bombardment of the reaction products, or by a heater, or preheated by heating means (not shown).

Figure 4:
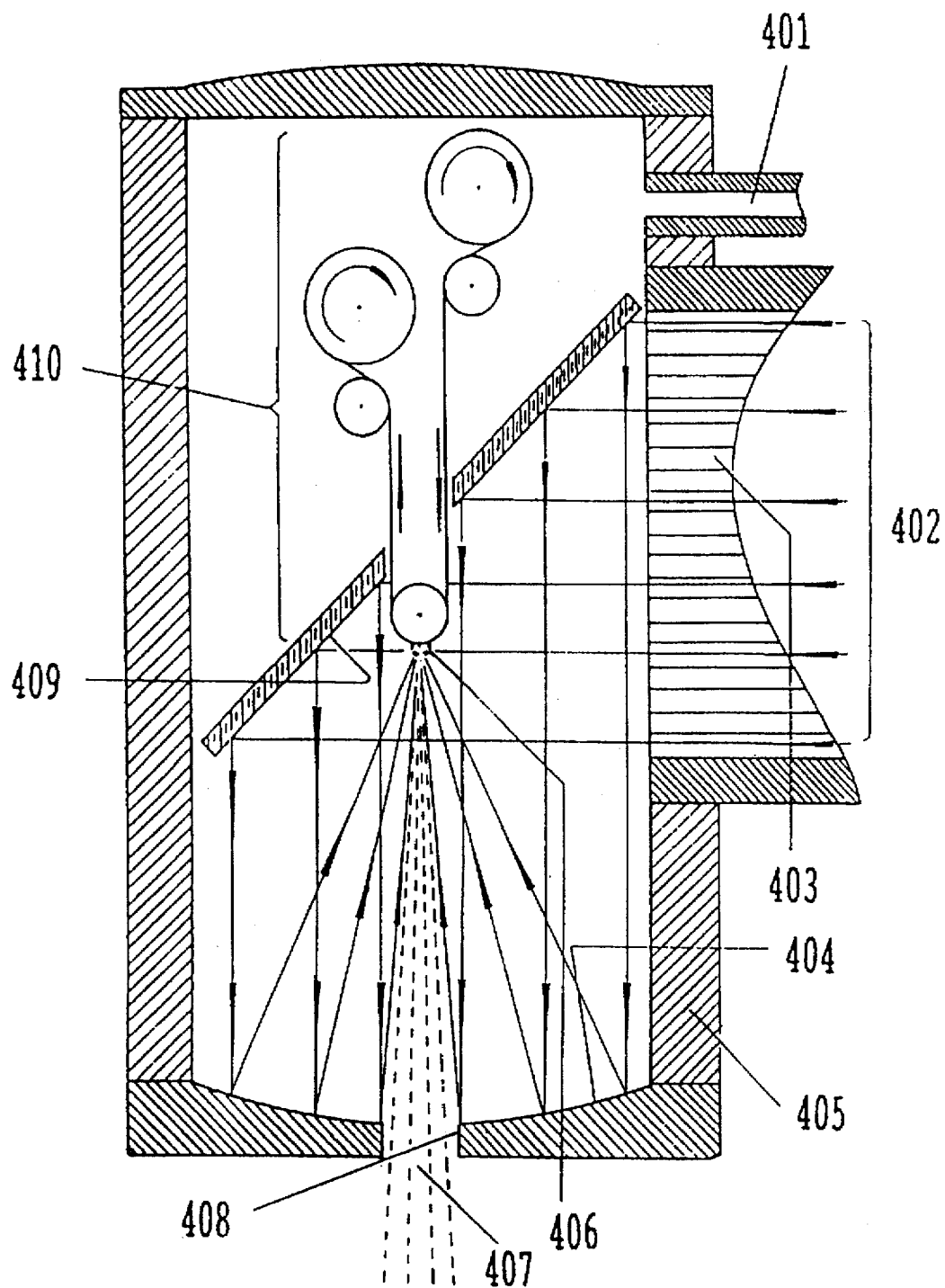
FIG. 4 is a schematic representation of a molecular spray coating device for chemical reactions energized by laser plasmas with a tape target driven by a tape feeder generating thereby synthetic ceramic coatings by this invention.

FIG. 4 shows a coating method with a molecular spray for carrying out the invention. The coating device is the forth type with chamber 405 for providing chemical reactions energized by laser plasmas for the purpose of coating. A laser beam source (not shown) with a fiber optic cable 403 provides low divergent laser beams 402 which are perpendicular to the axis of paraboloidal reflector 404. The low divergent laser beams are reflected by the mirror 409. The reflected laser beams incident on the surface of the paraboloidal reflector 404, having a hole 408. The paraboloidal reflector 404 reflects and focuses the laser beams on the facing surface of the moving target to form laser plasmas 406. The laser plasmas 406 evaporate, dissociate, and ionize the solid target materials to ions, electrons, and atoms. The recombinations of ions and electrons produce atoms. An inlet tube 401 provides an entrance for the reaction gas which reacts with ions and atoms resulting from the evaporated target material in laser plasmas. Chemical reactions energized by the laser plasmas 406 produce reaction products: molecular ions, radicals, and molecules. The products 407 which pass through the hole 408, serving as the coating nozzle, and deposits on the substrate (not shown). A coating is formed on the surface of the substrate. The assemble 410 is a tape feeder moving the target which supplies reactants by laser plasma evaporation. The tape feeder moves the flexible target with the speed that a new area is reached and an etched area is moved after each pulse of the laser plasmas. The substrate is heated by the converted kinetic energy of the bombardment of the reaction products.

Figure 5:
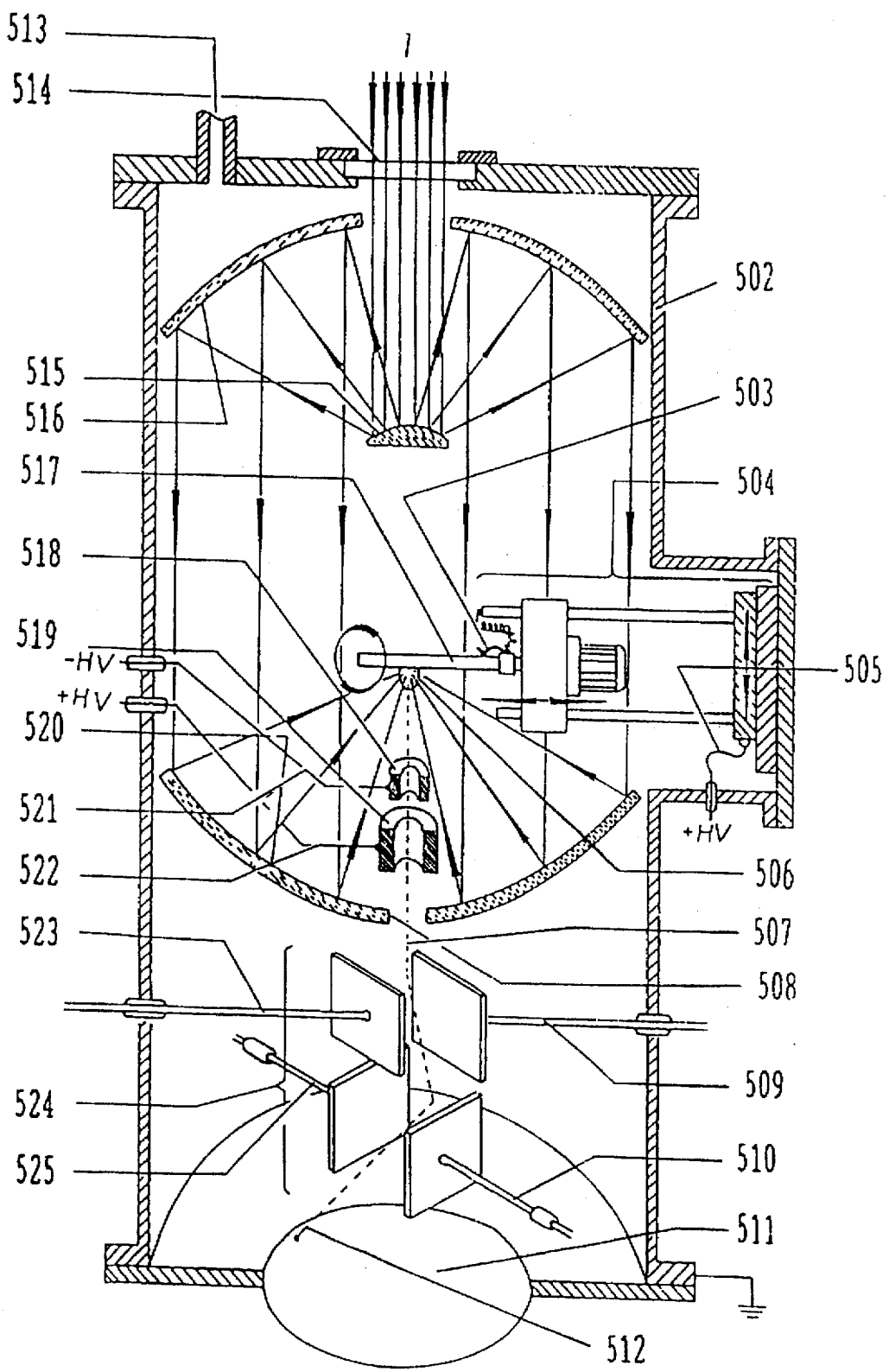
FIG. 5 is a schematic representation of a molecular ion beam coating device for chemical reactions energized by laser plasmas with a cylindric target driven by a rod feeder for generating thereby synthetic ceramic coatings with extremely high pattern resolution by this invention.
Figure 6:
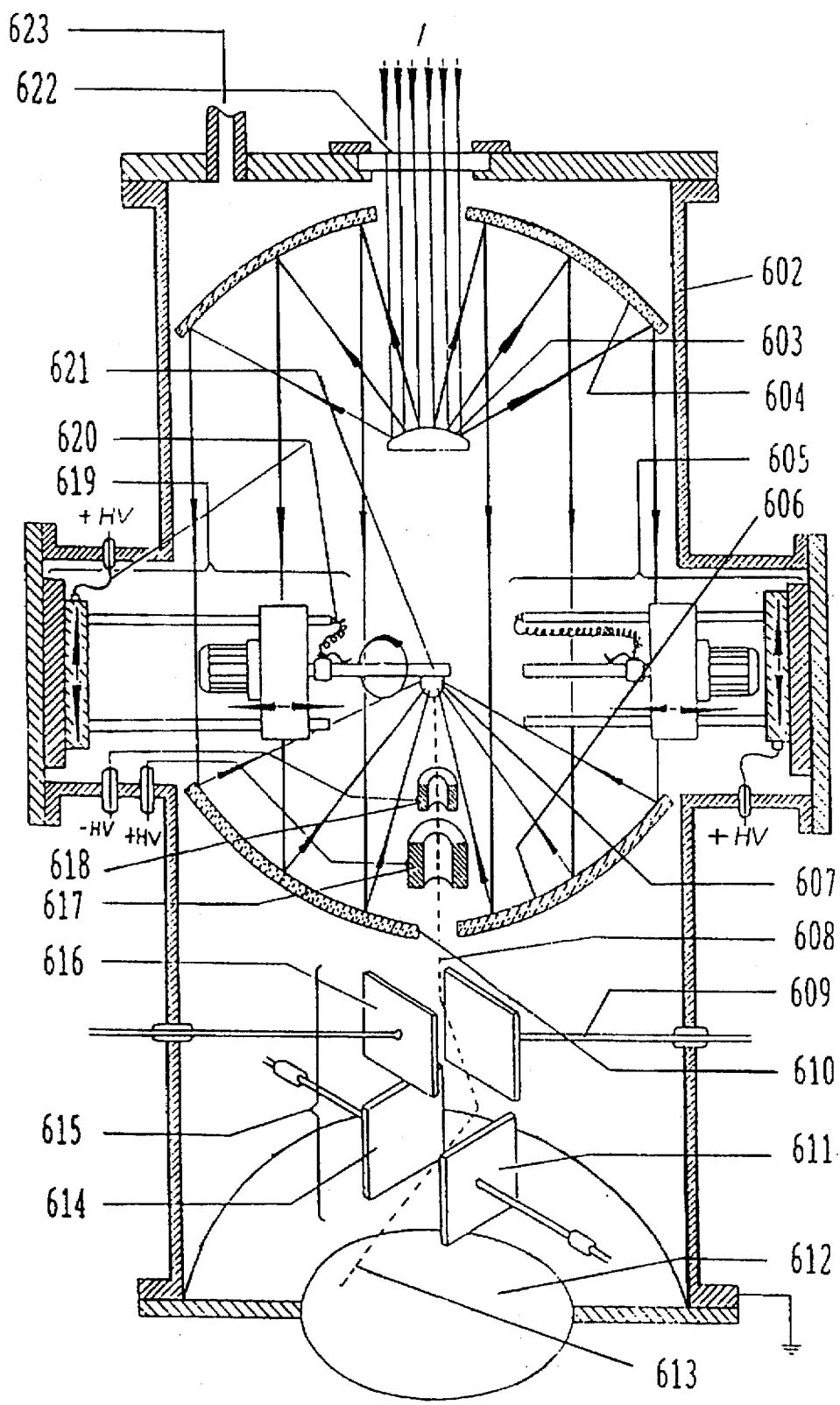
FIG. 6 is a schematic representation of a molecular ion beam coating device for chemical reactions energized by laser plasmas with two cylindric targets driven by two rod feeders which can be alternatively switched for generating thereby synthetic ceramic coatings with extremely high pattern resolution by this invention.

FIG. 5 shows a coating method with molecular ion beams for carrying out the invention. The coating device is the fifth type with chamber 502 for providing chemical reactions energized by laser plasmas for the purpose of coating. A laser beam source (not shown) with an optical system (not shown) provides low divergent laser beams 1 which are parallel to the coating device's chamber axis. The low divergent laser beams pass through the optical window 14 and enter the coating device chamber 502. The hyperboloidal reflector 515 reflects and disperses the input laser beams. The reflected laser beams incident on the surface of the paraboloidal reflector 516. The paraboloidal reflector 516 reflects and shapes the dispersed laser beams parallel to the optical axis of reflectors 516 and 520. The parallel laser beams incident on the surface of the paraboloidal reflector 520, having a hole 508. The paraboloidal reflector 520 reflects and focuses the parallel laser beams on the facing surface of the moving target 517 to form laser plasmas 506. The laser plasmas evaporate, dissociate and ionize the solid target material to ions, and electrons. A high voltage is applied between the chamber wall as a ground and the solid target as an anode connected to spring contact 503, poles, and wire 505. The positively charged solid target separates ions from electrons by repulsing ions and attracting electrons. An inlet tube 513 provides an entrance for the gas which reacts with ions to form molecular ions. The molecular ions are attracted by the cathode 518 connected to wire 521 to form molecular ion beams which pass through hole in the cathode 518, and the hole of the anode 519 connected to the wire 522. The anode 519 focuses molecular ion beams. The molecular ion beams 507 pass the hole 508 in the paraboloidal reflector 520, deflected by a electrostatic deflection system 524, which consists of two pairs of deflection plates. One pair is for X-axis deflection, the other pair is for Y-axis deflection. A magnetic deflection system may be mounted to replace electrostatic deflection system. This figure shows positive charges that are applied on the electric plate connected to wire 523 and negative charges that are applied on the electric plate connected to wire 509. A higher positive charges are applied on the electric plate connected to wire 510 and a lower negative charges are applied on the electric plate connected to wire 525. A negative electric field is applied between the substrate (not shown) as the cathode and the chamber wall as the electric ground. The deflected molecular ion beams 512 pass the exit 511, and deposits on the substrate (not shown) with extremely high pattern resolution. The assemble 504 is a mechanical device for the cylindric target which provides a movement consisting of a translation along the longitudinal axis of the cylindric target and rotation about the axis of the cylindric target which is perpendicular to the optical axis of the focusing reflector 520. This device has a X-Y-Z stage to adjust the cylindric target into a proper position respecting to the focusing point of reflector 520. The mechanical device moves the cylindric target with the speed that a new area is reached and an etched area is moved after each pulse of the laser plasmas. The substrate is heated by converted kinetic energy of the bombardment of the molecular ion beams and the energy released from the molecular ion-electron recombinations, FIG. 6 shows the sixth type of coating device with chamber 602 for providing chemical reactions energized by laser plasmas for the purpose of coating. This coating device produces two different compositions of molecular ion beams with two cylindric targets driven by two rod feeders which can be alternatively switched for carrying out the invention. This figure shows the condition that the mechanical assemble 619 is operating and assemble 605 is idle. A laser beam source (not shown) with an optical system (not shown) provides low divergent laser beams 1 which are parallel to the coating device's chamber axis. The low divergent laser beams pass through the optical window 622 and enter the coating device chamber 602. The hyperboloidal reflector 603 reflects and disperses the input laser beams. The reflected laser beams incident on the surface of the paraboloidal reflector 604. The paraboloidal reflector 604 reflects and shapes the dispersed laser beams parallel to the optical axis of reflectors 604 and 606. The parallel laser beams incident on the surface of the paraboloidal reflector 606, having a hole 610. The paraboloidal reflector 606 reflects and focuses the parallel laser beams on the facing surface of the moving target 621 to form laser plasmas 607. The laser plasmas evaporate, dissociate and ionize the solid target material to ions, and electrons. A high voltage is applied between the chamber wall as a ground and the solid target as an anode connected to spring contact, poles, and wire 620. The positively charged solid target separates ions from electrons by repulsing ions and attracting electrons. An inlet tube 623 provides an entrance for the gas which reacts with ions to form molecular ions. The molecular ions are attracted by the cathode 618 connected to -HV to form molecular ion beams which pass through hole in the cathode 618, and the hole of the anode 617 connected to the +HV. The anode 617 focuses molecular ion beams. The molecular ion beams 608 pass the hole 610 in the paraboloidal reflector 606, deflected by a electrostatic deflection system 615, which consists of two pairs of deflection plates. One pair is for X-axis deflection, the other pair is for Y-axis deflection. A magnetic deflection system may be mounted to replace the electrostatic deflection system. This figure shows positive charges that were applied on the electric plate 616 and negative charges that were applied on the electric plate 609. Higher positive charges were applied on the electric plate 611 and lower negative charges were applied on the electric plate 614. A negative electric field is applied between the substrate (not shown) as the cathode and the chamber wall as the electric ground. The deflected molecular ion beams 613 pass the exit 612, and deposits on the substrate (not shown) with extremely high pattern resolution. The assembles 619 and 605 are mechanical devices for the cylindric targets which provide the movements consisting to the translations along the longitudinal axes of the cylindric targets and rotation about the axes of the cylindric targets which are perpendicular to the optical axis of the focusing reflector 606. This device has a X-Y-Z stages to adjust the cylindric targets into a proper position respecting to the focusing point of the reflector 606. The mechanical device moves the cylindric target with the speed that a new area is reached and an etched area is moved after each pulse of the laser plasmas. The substrate is heated by converted kinetic energy of the bombardment of the molecular ion beams and the energy released from the molecular ion-electron recombinations.

EXAMPLE 1

A $SnO_A$ coating glass was used as a substrate. The frequency doubled Q-switched Nd:YAG laser having 10 Hz repetition rate and a pulse duration of of 25 nanosecond at wavelength of 532 nm with an average power of 25 W was used as a laser beam source for the coating devices. Coating device A was the first type shown in FIG. 1. The sold target in coating device A was a 1.6 mm diameter wire contorting 99.99% copper. Coating devices B, C and D were the second type shown in FIG. 2. The solid target in coating device B was a rod 5 mm in diameter containing 73.21% barium oxide and 26.78% calcium oxide. The solid target in coating device C was a rod 5 mm in diameter containing 99.99% thallium oxide. All coating devices were mounted on a rotary turret. The reaction gas for all reaction devices was 450 torrs of triethylboran. The main chamber containing all the coating devices was under $10^{-2}$ torrs of vacuum pressure, wherein a substrate was held at a fixed position under the selected coating device that was operating for coating. An optical system collimated 532 nm laser beams through one of the optical windows of the selected coating device. A stepping motor drove the turret and positioned one of the coating devices selected to align the optical window against the output laser beams. The plasmas were formed by focusing 532 nm laser beams to about 10–25 GW•cm$^{-2}$ near the moving surface of the solid target. The coating process comprises of: (I) rotating rotary turret to the position where the laser beams were collimated to the coating device A to coat on the substrate with a mono-molecular layer of $Cu_3B$, (II) rotating rotary turret to the position where the laser beams were collimated to the coating device B to coat on the substrate with a mono-molecular layer of $BaCaB_{12}$ (III) rotating rotary turret to the position where the laser beams were collimated to the coating device C to coat on the substrate with a mono-molecular layer of TlB, (IV) rotating rotary turret to the position where the laser beams were collimated to the coating device B2 to coat on the substrate with a mono-molecular layer of $BaCaB_{12}$ (V) repeat the procedure from I to IV 1000 times, until a 2000-layered ceramic superconducting superlattice is obtained.

EXAMPLE 2

A second type of a coating device shown in FIG. 2 was used for coating. The solid target was a rod 5 mm in diameter, which contains 40.1% titanium oxide, 34.9% boron oxide, and 25.0% polyvinylpyridine hydrochloride. The reaction gas was ammonia at 400 torrs of pressure. ArF excimer laser at UV wavelength of 193 nm having a 50 Hz repetition rate and a pulse duration of 23 nanosecond with an average laser power of 12 W was used as a laser beam source. The plasmas were formed by focusing ArF laser beams to about 5–10 GW•cm$^{-2}$ near the moving surface of the solid target. An aperture mask is placed between the back of the focusing reflector and the substrate, coating 200 patterns sequentially on the substrate with 3–5 micro thickness of mixed crystals of titanium nitride and boron nitride. After each coating a mask with a new pattern was placed above the substrate and the substrate was also moved to a new position by a linear stage drove by a stepping motor. The total laser doses of 193 nm UV for a 4 micrometer thickness and 1 cm$^2$ area of the coating requires about 30–45 Joule of laser energy.

EXAMPLE 3

KrF excimer laser at UV wavelength of 248 nm having a 50 Hz repetition rate and a pulse duration of 34 nanosecond with an average laser power of 20 W was used as a laser beam source for all coating devices. Three coating devices, A, B, C, and E were the third type shown in FIG. 3. The coating devices D and F, were the third type, however, the solenoidal gas nozzle was replaced by cylindrical target drivers shown in FIG. 2. A laser boring device had an optical system for collimating and focusing the 248 nm laser beams on the substrate to form laser plasmas for microlithography. All coating devices and the laser boring device are mounted on a rotary turret. An optical system with a mirror which could collimate 248 nm UV laser beams either through the concave lens and enter the coating device or through the window on the laser boring device. A stepping motor drove the turret and positioned a coating device to align the concave lens against the output UV laser beams of the optical system. The incident laser beams are diverged, reflected, further diverged, reflected and shaped parallel to the focusing paraboloidal reflector. The plasmas were formed by focusing KrF laser beams to about 10–20 GW•cm$^{-2}$ near the front space of a solenoidal gas jet or on the surface of cylindrical rods. The coating device A had a reaction gas mixture of 74.000% methyltrichlorosilane and 24.999% hydrogen which were ejected from the solenoidal gas nozzle. The coating device B had a gas mixture of 49.9999% gallium hydride, 49.9999% arsenic chloride, and 0.0002% ammonia which were ejected from a solenoidal valve. The coating device C had a gas mixture of 49.9999% gallium hydride, 29.9999% arsine, 19.9999% phosphine. Coating device D had a 99.9999% silicon rod 15 mm in diameter and reaction gas of 99.9999% nitrogen at 250 torrs of pressure. The coating device E had a gas mixture of 59.00% platinum carbonyl chloride and 40.00% hydrogen. The coating device F was a copper rod 15 mm in diameter with helium gas at 10 torrs of pressure. A X-Y stage for holding the aperture mask was mounted on table for holding the substrate. All coating devices, laser boring device, rotary table, X-Y stage with aperture mask, substrate table with substrate were mounted in the vacuum chamber at $10^{-2}$ torrs. A transistor matrix film made by vapor deposition and etching on a glass was used as substrate. The coating process comprises of: (I) rotating rotary turret to the position where the laser beams were collimated to the coating device A, positioning a dot matrix aperture mask at a first position above the substrate without touching it, coating the substrate with silicon carbide having the thickness of 5 micrometers to form blue LED (Light Emitting Diode) dot matrix, (II) rotating rotary turret to the position where the laser beams were collimated to the coating device B, horizontally moving the dot matrix aperture mask a distance of 6.25 micron from the first position and keeping the vertical distance above the substrate, coating the substrate with gallium phosphide doped with nitrogen impurity having the thickness of 5 micrometers to form green LED dot matrix, (III) rotating rotary turret to the position where the laser beams were collimated to the coating device C, horizontally moving the dot matrix aperture mask a equal distance of 6.25 micron from the first and second position and keeping the vertical distance above the substrate, coating the substrate with gallium arsenide phosphide having the thickness of 5 micrometers to form red LED dot matrix, (IV) rotating rotary turret to the position where the excimer laser beams were collimated to the coating device D to coat on the said substrate with 2.5 micrometers thickness film of silicon nitride, (V) rotating rotary turret to the position where the excimer laser beams were collimated to the laser boring device to bore holes on silicon nitride coating layer by laser evaporation to reach the surface of LED dot matrixes, (VI) rotating rotary turret to the position where the excimer laser beams were collimated to the coating device E to coat on the surface of boring holes a conductive matrix with 0.25 micrometer thickness of platinum, (VII) rotating rotary turret to the position where the excimer laser beams were collimated to the coating device F to coat on the surface with 10–25 micron thickness of copper film, (VIII) rotating rotary turret to the position where the excimer laser beams were collimated to the coating device D to coat on the said substrate with 50–100 micrometers thickness film of silicon nitride. The finished full color screen had very high resolution and was very thin in thickness.

EXAMPLE 4

A polished fused silica was used as a substrate. Two XeCl excimer lasers at UV wavelength of 308 nm having a maximum of 100 Hz repetition rate and a pulse duration of 28 nanosecond with a maximum average laser power of 40 W were used as a laser beam source for all coating devices. Two coating devices, A and B, were the second type shown in FIG. 2 with 99.99% silicon rods drove by cylindrical target drivers. Both coating devices are mounted on a vacuum chamber under $10^{-2}$ torrs and aimed to coat simultaneously the same substrate. Each coating device had XeCl excimer laser with an adjustable repetition rate of laser pulses. The plasmas were formed by focusing XeCl laser beams to about 10–20 GW•cm$^{-2}$ on the surface of cylindrical rods. The coating device A had a reaction gas of 99.99% oxygen at 250 torrs of pressure. The coating device B had a reaction gas of 99.99% nitrogen at 250 torrs of pressure. The coating process was to obtain an apodized 100 sinusoidal rugate modulation cycles in a 60 μm thickness by turning the repetition rates of both XeCl excimer lasers to coat with varying silicon oxynitride composition ratio of silica (refractive index 1.46) and silicon nitride (refractive index 2.04). The refractive index started at 1.75 to a maximum amplitude of from 1.50 to 2.00 and ended at 1.75 on the free surface. The finished optical filter had excellent sideband suppression.

EXAMPLE 5

A forth type of coating device was used for coating teeth, wherein an aluminum tape 0.2 mm thick and 3.5 mm wide was moved by a tape feeder. The reaction gas was a mixture of 50% oxygen and 50% nitrogen at a pressure slightly above atmosphere. The frequency doubled Q-switched Nd:YAG laser having a 10 Hz repetition rate and a pulse duration of 25 nanosecond at the wavelength of 532 nm with an average power of 50 W was used as a laser beam source. The plasmas were formed by focusing 532 nm laser beams to about 7.5–15 GW•cm$^{-2}$ near the moving surface of the solid target. The tape feeder moved the flexible tape with the speed that a new area is reached and an etched area is moved after each pulse of the laser plasmas. The total laser doses of 532 nm laser energy for a 5 micro thickness and 1 cm$^2$ area coating of alumina required about 60–100 Joule.

EXAMPLE 6

KrF excimer laser at UV wavelength of 248 nm having a 50 Hz repetition rate and a pulse duration of 34 nanosecond with an average laser power of 20 W was used as a laser beam source for all coating devices. Three coating devices, A, B, C, D, and E were the fifth type shown in FIG. 5. The coating device F, G, and H were a fifth type, however, a solenoid gas jet replaced the cylindric target driver. The coating device J was the sixth type, however, two gas jets replaced two cylindrical target drivers shown in FIG. 6. A laser boring device had an optical system for collimating and focusing the 248 nm laser beams on the substrate to form laser plasmas for microlithography. All coating devices and laser boring device were mounted on a rotary turret. An optical system with a mirror collimated 248 nm UV laser beams through one of the windows of the coating devices. A stepping motor drove the turret and positioned one of the coating devices to accept UV laser beams. The incident laser beams were diverged, reflected, further diverged, reflected and shaped parallel to the focusing paraboloidal reflector. The plasmas were formed by focusing KrF laser beams to about 10–20 GW•cm$^{-2}$ near the front space of a solenoidal gas jet or on the surface of cylindrical rods. Coating device A had a 99.9999% silicon rod 15 mm in diameter and 99.9999% helium gas at 25 torrs. Coating device B had a 99.9999% silicon rod 15 mm in diameter and a gas mixture of 99.9997% helium and 0.0002% antimony chloride at 25 torrs of pressure. Coating device C had a 99.9999% silicon rod 15 mm in diameter and a gas mixture of 99.9999% helium and 0.0002% of boron bromide at 25 torrs of pressure. Coating device D had a 99.9999% silicon rod 15 mm in diameter and a gas mixture of 99.9999% helium and 0.0002% of phosphonyl chloride at 25 torrs of pressure. Coating device E had a 99.99% zirconium rod 15 mm in diameter and a gas mixture of 24.99% boron bromide and 74.9999% helium. The coating device F had a gas mixture of 49.999% ammonia and 49.9999% helium, and the gas jet had 99.99% boron chloride. The coating device G had a gas mixture of 49.99% ammonia and 49.9999% helium, and the gas jet had 99.99% silicon chloride. The coating device H had 99.9999% hydrogen gas, the gas jet had a gas mixture of 49.99% silicon chloride and 49.999% carbon monoxide which were ejected from the solenoidal gas nozzle. The coating device J had a gas mixture of 49.9999% gallium hydride, gas jet A had a gas mixture of 99.9998% arsenic chloride, and 0.0002% ammonia, gas jet B had a gas mixture of 59.9999% arsine, 39.9999% phosphine. A precise X-Y stage for holding the substrate. All coating devices, rotary turret, X-Y stage with substrate were mounted in the vacuum chamber at $10^{-4}$ torts. A boron glass was coated with zirconium boride and used as substrate. The coating process comprises of: (I) rotating turret to collimate laser beams to the coating device A, coating the substrate with silicon N$^+$ base circuits, (II) rotating turret to collimate laser beams to the coating device B, coating the substrate with antimony doped silicon circuits of selective N$^+$ layer, (III) rotating turret to collimate laser beams to the coating device A, coating the substrate with silicon circuit epitaxy, (IV) rotating turret to collimate laser beams to the coating device C, coating the substrate with boron doped silicon circuit P$^+$ insulation layer, (V) rotating turret to collimate laser beams to the coating device D, coating the substrate with phosphorus doped silicon circuit N$^+$ layer, (VI) rotating turret to collimate laser beams to the coating device C, coating the substrate with boron doped silicon circuit P$^+$ base layer, (VII) rotating turret to collimate laser beams to the coating device E, coating the substrate with zirconium boride circuit conductive layer, (VIII) rotating turret to collimate laser beams to the coating device F, coating the substrate with boron nitride resistant layer, (IX) rotating turret to collimate laser beams to the coating device D, coating the substrate with phosphorus doped silicon diffusive emitters, (X) rotating turret to collimate laser beams to the coating device G, coating the substrate with silicon nitride passivation layer, (XI) rotating turret to collimate laser beams to the laser boring device to bore windows on silicon nitride coating layer, (XII) rotating rotary turret to the position where the laser beams were collimated to the coating device H, coating silicon carbide blue LED dot matrix, (XIII) rotating rotary turret to the position where the laser beams were collimated to the coating device J, moving gas nozzle A to approach the focusing point of the reflector for forming laser plasmas, coating nitrogen doped gallium phosphide green LED dot matrix, (XIV) rotating rotary turret to the position where the laser beams were collimated to the coating device J, moving gas nozzle B to approach the focusing point of the reflector for forming laser plasmas, coating gallium arsenide phosphide red LED dot matrix, (XV) rotating turret to collimate laser beams to the coating device G, coating the substrate with silicon nitride insulation layer, (XVI) rotating turret to collimate laser beams to the laser boring device to bore windows on silicon nitride coating layer, (XVII) rotating turret to collimate laser beams to the coating device E, coating the substrate with zirconium boride circuit conductive layer. The finished full color transistor-LED screen had very high resolution and was very thin in thickness.

Although the present invention has been described with respect to specific embodiments thereof, various changes and modifications may be suggested to one skilled in the art. Therefore, it is intended that the present invention include such changes and modifications as fall within the scope of the appended claims.

What is claimed is:

1. A method for producing a ceramic coating on a substrate comprising the steps of:

providing at least a chamber having at least a gas inlet;

providing at least a reactant, either a gas from a nozzle, or a target with at least a moving surface;

providing at least a reflector with a hole in a paraboloidal or ellipsoidal surface, between said substrate and either said nozzle or said target;

focusing at least a laser beam by said reflector, either in a space in front of said nozzle, or substantially on said moving surface of said target to form at least a laser plasma from said reactant and such that an optical axis of said laser beam is perpendicular to said gas sprayed by said nozzle;

forming a mixture of radicals, molecules, and molecular ions by chemical reactions involving said laser plasma, wherein said mixture passes through said hole in said reflector; and forming said ceramic coating on said substrate from said mixture.

2. A method for forming a ceramic coating as claimed in claim 1, wherein said gas from said nozzle is either a species of molecules or a mixture of species of molecules, wherein at least one of said species of molecules has at least one element which is selected from the group consisting of B, C, Si, N, P, As, O, S, Se, Te, F, Cl, Br, I, Y, La, Ce, Pr, Nd, Sm, Eu, Gd, Tb, Dy, Ho, Er, Tm, Yb, Lu, Sc, Ti, Zr, Hf, V, Nb, Ta, Cr, Mo, W, Mn, Fe, Co, Ni, Rh, Pd, Os, Pr, Cu, Ag, Au, Zn, Cd, Hg, Al, Ca, In, Tl, Ge, Sn, Pb, Sb, Bi, and a mixture thereof.

3. A method for forming a ceramic coating as claimed in claim 1, wherein said target is comprised of at least one element which is selected from the group consisting of B, C, Si, N, P, As, O, S, Se, Te, F, Cl, Br, I, Li, Na, K, Rb, Be, Mg, Ca, Sr, Ba, Y, La, Ce, Pr, Nd, Sm, Eu, Gd, Tb, Dy, Ho, Er, Tm, Yb, Lu, Sc, Ti, Zr, Hf, V, Nb, Ta, Cr, Mo, W, Mn, Fe, Co, Ni, Rh, Pd, Os, Pr, Cu, Ag, Au, Zn, Cd, Hg, Al, Ga, In, Tl, Ge, Sn, Pb, Sb, Bi, and a mixture thereof.

4. A method for forming a ceramic coating as claimed in claim 1, wherein said reactant is a plurality of targets, wherein at least two different targets, from said plurality of targets, comprise of at least a different element which is selected from the group consisting of B, C, Si, N, P, As, O, S, Se, Te, F, Cl, Br, I, Li, Na, K, Rb, Be, Mg, Ca, Sr, Ba, Y, La, Ce, Pr, Nd, Sm, Eu, Gd, Tb, Dy, Ho, Er, Tm, Yb, Lu, Sc, Ti, Zr, Hf, V, Nb, Ta, Cr, Mo, W, Mn, Fe, Co, Ni, Rh, Pd, Os, Pr, Cu, Ag, Au, Zn, Cd, Hg, Al, Ga, In, Tl, Ge, Sn, Pb, Sb, Bi, and a mixture thereof; and focusing said laser beam by said reflector substantially on said moving surface of one of said plurality of targets by switching at least once in a sequence from between said at least two different targets to form said laser plasma.

5. A method for forming a ceramic coating as claimed in claim 1, wherein said reactant is a plurality of reactants selected from the group consisting of a plurality of gases from nozzles, a plurality of targets, or a mixture thereof; wherein at least two different reactants, from said plurality of reactants, comprise of at least a different element which is selected from the group consisting of B, C, Si, N, P, As, O, S, Se, Te, F, Cl, Br, I, Li, Na, K, Rb, Be, Mg, Ca, Sr, Ba, Y, La, Ce, Pr, Nd, Sm, Eu, Gd, Tb, Dy, Ho, Er, Tm, Yb, Lu, Sc, Ti, Zr, Hf, V, Nb, Ta, Cr, Mo, W, Mn, Fe, Co, Ni, Rh, Pd, Os, Pr, Cu, Ag, Au, Zn, Cd, Hg, Al, Ga, In, Tl, Ge, Sn, Pb, Sb, Bi, and a mixture thereof;

wherein at least another reflector directs said laser beam to said reflector wherein said another reflector has another hole;

wherein said laser beam is a plurality of laser beams.

6. A method for forming a ceramic coating as claimed in claim 5, wherein a power or a repetition rate of at least one laser beam from said plurality of laser beams is modulated to modulate compositions or crystal structures of said ceramic coating.

7. A method for forming a ceramic coating as claimed in claim 1, wherein at least an accelerate electric field is applied in a space between said reflector and said nozzle, or said reflector and said target.

8. A method for forming a ceramic coating as claimed in claim 6, wherein a plurality of electric fields are applied in a plurality of spaces between said reflectors and said nozzles, or said reflectors and said targets.

9. A method for forming a ceramic coating as claimed in claim 1, wherein at least an aperture mask is placed between said substrate and said reflector during forming of said coating wherein there are a plurality of coating steps.

10. A method for forming a ceramic coating as claimed in claim 9, wherein said aperture mask is repositioned from one position to another position between said coating steps.

11. A method for forming a ceramic coating as claimed in claim 9, wherein said aperture mask is a plurality of aperture masks, wherein an aperture mask from said plurality of aperture masks is placed between said substrate and said deflector, wherein said aperture mask is selected from the group consisting of switching one aperture mask to another aperture mask in a sequence, repositioning said aperture mask from one position to another position, or by a mixture thereof.

12. A method for forming a ceramic coating as claimed in claim 9, wherein said substrate is repositioned from one position to another position between said coating steps.

13. A method for forming a ceramic coating as claimed in claim 1, wherein said chamber is kept at a pressure of under $10^{-4}$ torrs to 1 atmosphere.

14. A method for forming a ceramic coating as claimed in claim 1 wherein said chamber is a main chamber, wherein said main chamber encloses a plurality of chambers.

15. A method for forming a ceramic coating as claimed in claim 1, wherein said substrate is heated by a heating means.

16. A method for forming a ceramic coating as claimed in claim 1, wherein said ceramic coating and said target has different compositions or different crystal structures.

17. A method as claimed in claim 1, whereafter said substrate is removed, and said ceramic coating free from substrates, is obtained.

18. A method for forming a patterned ceramic coating as claimed in claim 1, wherein a X-Y stage for holding said substrate is provided.

19. A method for producing a patterned ceramic coating on a substrate comprising the steps of:

providing at least a chamber kept under a vacuum having at least a gas inlet;

providing at least a reactant, either a gas from a nozzle, or a target with at least a moving surface;

providing at least a reflector with a hole in a paraboloidal or ellipsoidal surface, between said substrate and either said nozzle or said target;

providing at least an ion focusing device using either an electrostatic field or a magnetic field;

providing at least an ion deflection system using either an electrostatic field or a magnetic field, wherein said deflection system consists of a X-deflection device and a Y-deflection device;

focusing at least a laser beam by said reflector, either in a space in front of said nozzle, or substantially on said moving surface of said target to form at least a laser plasma from said reactant and such that an optical axis of said laser beam is perpendicular to said gas sprayed by said nozzle, wherein said laser plasma consists of ionized gases;

applying at least an electric field to accelerate said ionized gases;

forming product ions by chemical reactions involving said ionized gases, wherein said product ions pass through said hole in said reflector;

focusing said product ions by said ion focusing device to form an ion beam;

deflecting said ion beam by said deflection devices;

charging said substrate with negative charges for neutralizing positive charges from said ion beam; and forming said patterned ceramic coating on said substrate from said ion beam.

20. A method for forming a patterned ceramic coating as claimed in claim 19, wherein said gas from said nozzle is either a species of molecules or a mixture of species of molecules, wherein at least one of said species of molecules has at least one element which is selected from the group consisting of B, C, Si, N, P, As, O, S, Se, Te, F, Cl, Br, I, Y, La, Ce, Pr, Nd, Sm, Eu, Gd, Tb, Dy, Ho, Er, Tm, Yb, Lu, Sc, Ti, Zr, Hf, V, Nb, Ta, Cr, Mo, W, Mn, Fe, Co, Ni, Rh, Pd, Os, Pr, Cu, Ag, An, Zn, Cd, Hg, Al, Ga, In, Tl, Ge, Sn, Pb, Sb, Bi, and a mixture thereof.

21. A method for forming a patterned ceramic coating as claimed in claim 19, wherein said target comprises of at least one element which is selected from the group consisting of B, C, Si, N, P, As, O, S, Se, Te, F, Cl, Br, I, Li, Na, K, Rb, Be, Mg, Ca, Sr, Ba, Y, La, Ce, Pr, Nd, Sm, Eu, Gd, Tb, Dy, Ho, Er, Tm, Yb, Lu, Sc, Ti, Zr, Hf, V, Nb, Ta, Cr, Mo, W, Mn, Fe, Co, Ni, Rh, Pd, Os, Pr, Cu, Ag, Au, Zn, Cd, Hg, Al, Ga, In, Tl, Ge, Sn, Pb, Sb, Bi, and a mixture thereof.

22. A method for forming a patterned ceramic coating as claimed in claim 19, wherein said reactant is a plurality of targets, wherein at least two different targets, from said plurality of targets, comprise of at least a different element which is selected from the group consisting of B, C, Si, N, P, As, O, S, Se, Te, F, Cl, Br, I, Li, Na, K, Rb, Be, Mg, Ca, Sr, Ba, Y, La, Ce, Pr, Nd, Sm, Eu, Gd, Tb, Dy, Ho, Er, Tm, Yb, Lu, Sc, Ti, Zr, Hf, V, Nb, Ta, Cr, Mo, W, Mn, Fe, Co, Ni, Rh, Pd, Os, Pr, Cu, Ag, An, Zn, Cd, Hg, Al, Ga, In, Tl, Ge, Sn, Pb, Sb, Bi, and a mixture thereof; and focusing said laser beam by said reflector substantially on said moving surface of one of said plurality of targets by switching at lease once in a sequence between said at least two different targets to form said laser plasma.

23. A method for forming a patterned ceramic coating as claimed in claim 19, wherein said reactant is a plurality of reactants selected from the group consisting of a plurality of gases from nozzles, a plurality of targets, or a mixture thereof; wherein at least two different reactants, from said plurality of reactants, comprise of at least a different element which is selected from the group consisting of B, C, Si, N, P, As, O, S, Se, Te, F, Cl, Br, I, Li, Na, K, Rb, Be, Mg, Ca, Sr, Ba, Y, La, Ce, Pr, Nd, Sm, Eu, Gd, Tb, Dy, Ho, Er, Tm, Yb, Lu, Sc, Ti, Zr, Hf, V, Nb, Ta, Cr, Mo, W, Mn, Fe, Co, Ni, Rh, Pd, Os, Pr, Cu, Ag, Au, Zn, Cd, Hg, Al, Ga, In, Tl, Ge, Sn, Pb, Sb, Bi, and a mixture thereof;

wherein said reflector is a plurality of reflectors, wherein each of said reflectors have a hole;

wherein said laser beam is a plurality of laser beams;

wherein said electric field is a plurality of electric fields;

wherein said ion focusing device is a plurality of ion focusing devices; and wherein said ion deflection system is a plurality of ion deflection systems.

24. A method for forming a patterned ceramic coating as claimed in claim 23, wherein a power or a repetition rate of at least one laser beam from said plurality of laser beams is modulated to modulate compositions or crystal structures of said patterned ceramic coating.

25. A method for forming a patterned ceramic coating as claimed in claim 19, whereafter said substrate is removed, and said ceramic coating free from substrates is obtained.

26. A method for forming a patterned ceramic coating as claimed in claim 19, wherein said chamber is a main chamber, wherein said main chamber encloses a plurality of chambers.

27. A method for forming a patterned ceramic coating as claimed in claim 19, wherein said ceramic coating and said target has different compositions or different crystal structures.

28. A method for forming a patterned ceramic coating as claimed in claim 19, wherein a X-Y stage for holding said substrate is provided.

* * * * *